Figure 1:
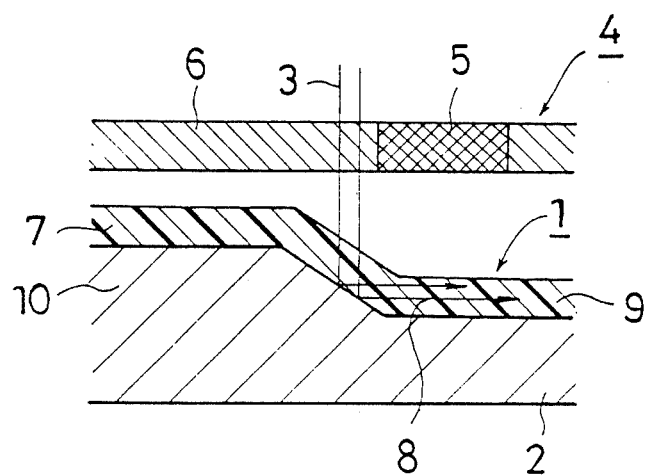
Figure 2:
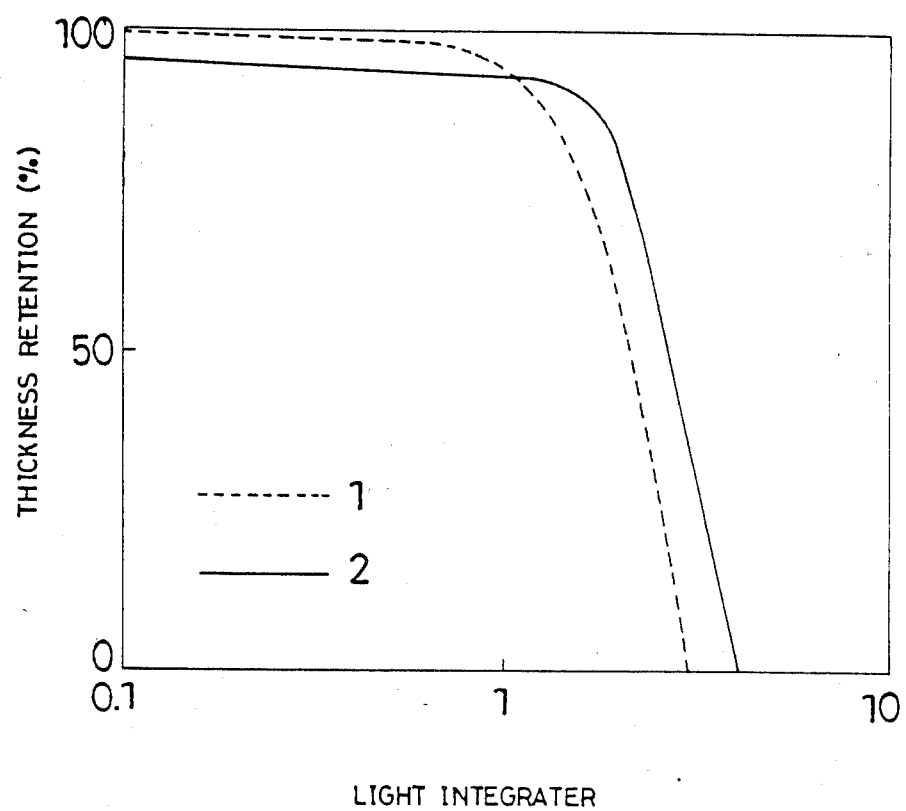
Figure 3:
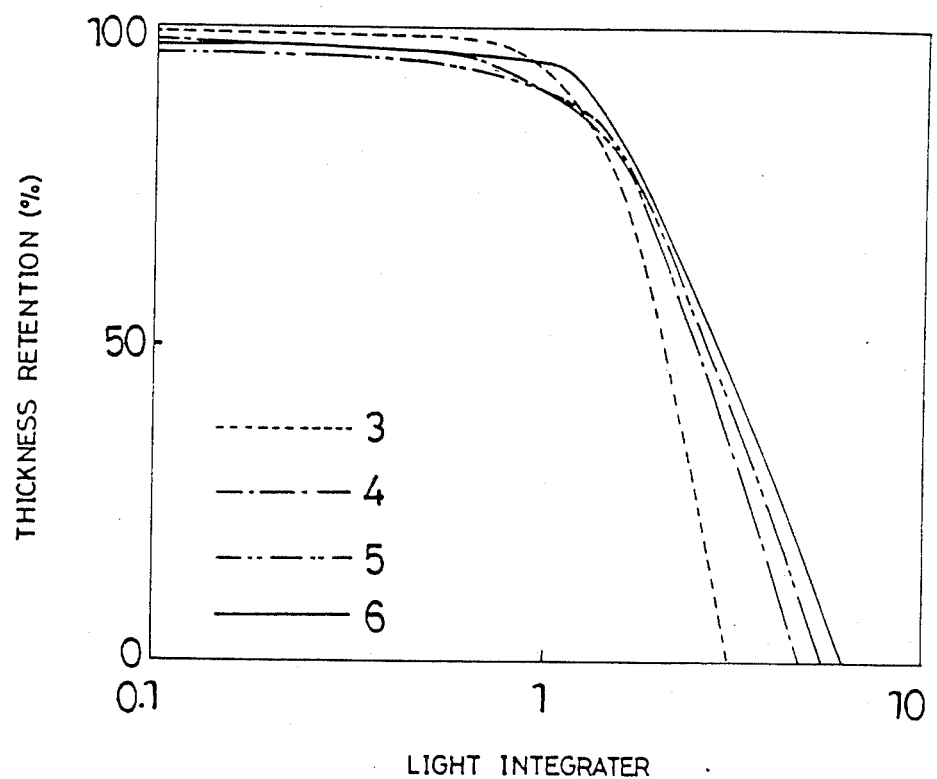
Figure 4:
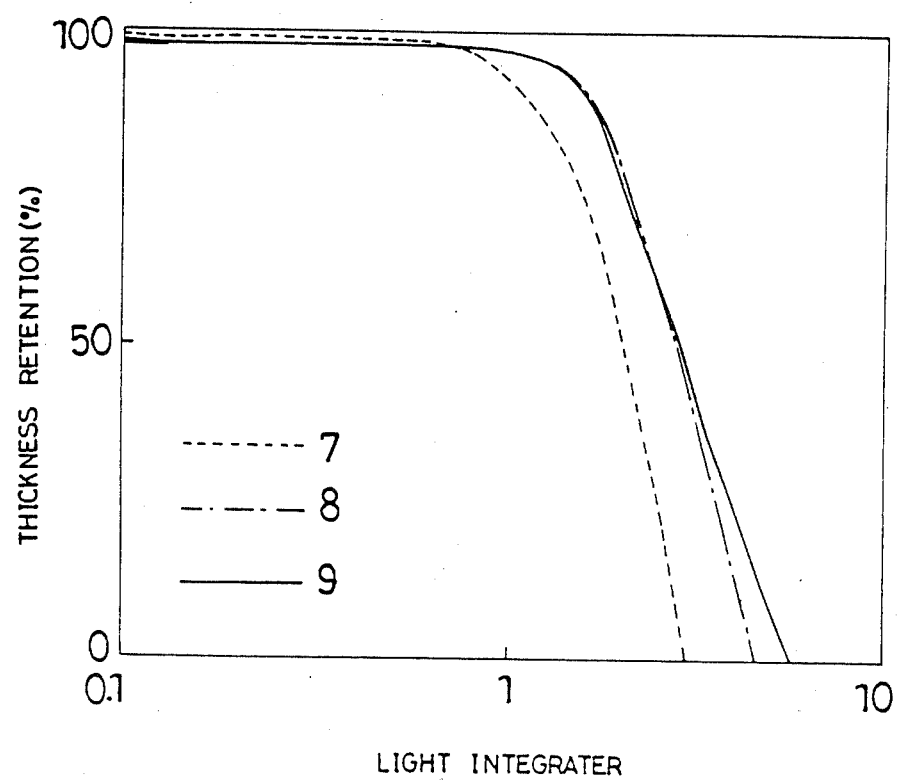
Figure 5:
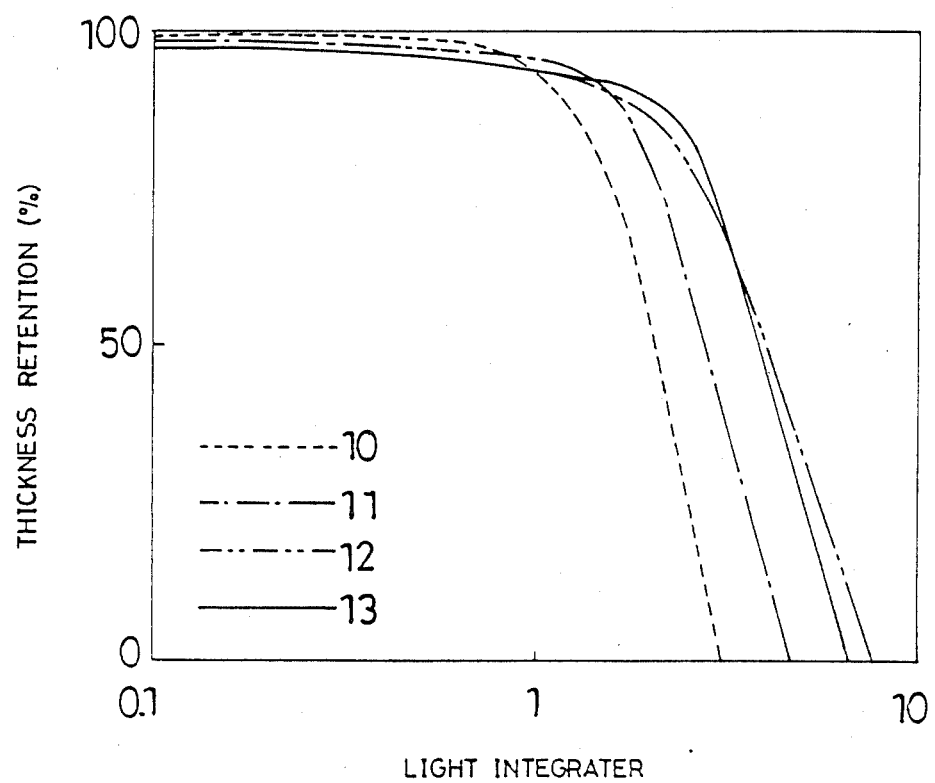
Figure 6:
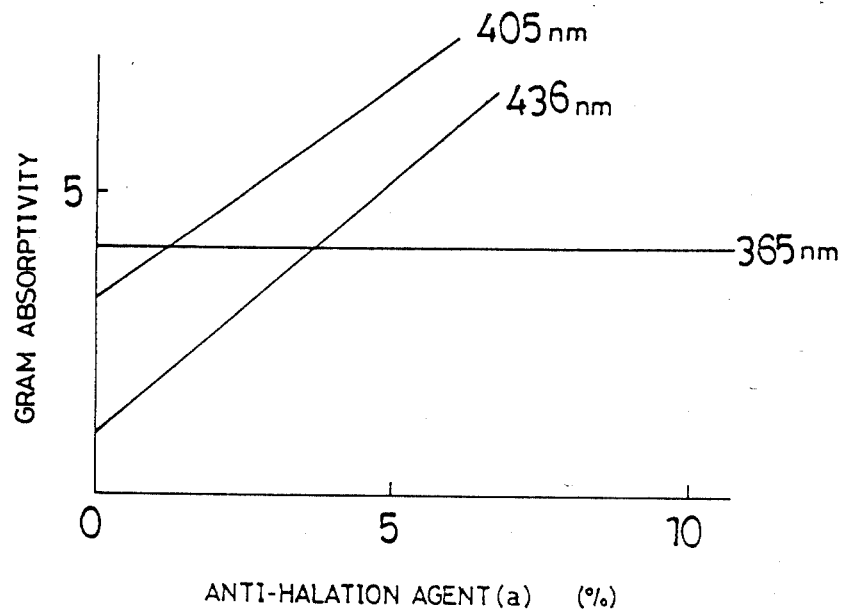
Figure 7:
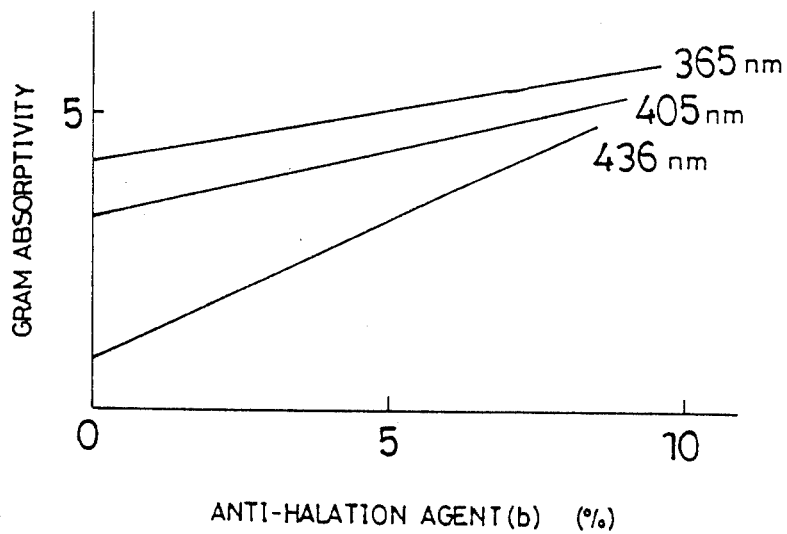
Figure 8:
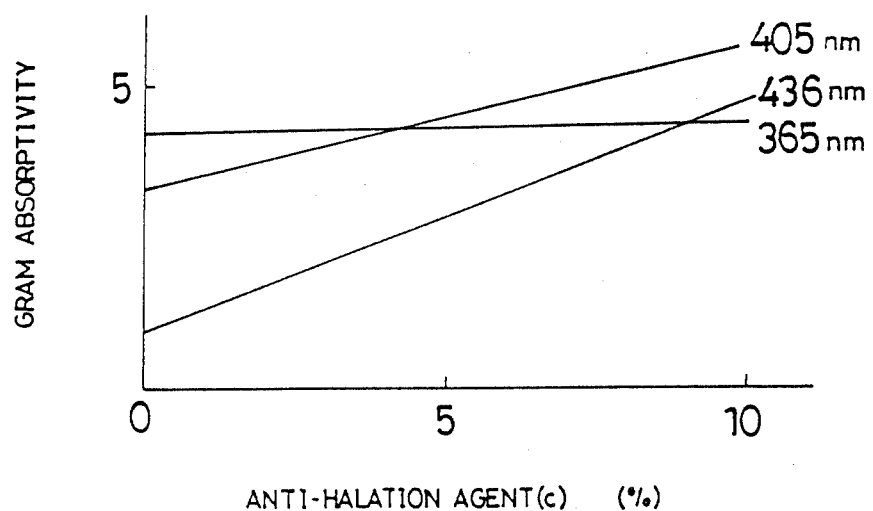
Figure 9:
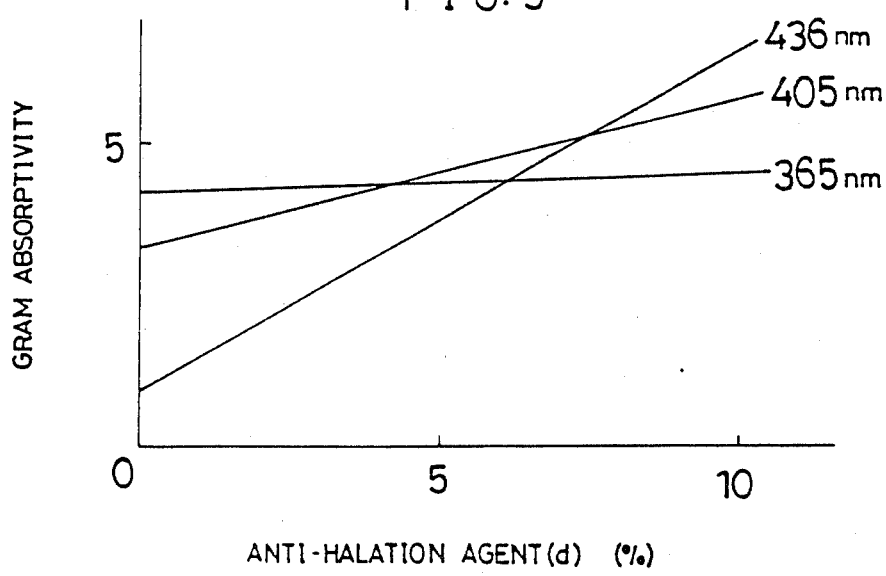

United States Patent [19]
Kotani et al.

[11] Patent Number: 4,575,480
[45] Date of Patent: Mar. 11, 1986

[54] PHOTORESIST COMPOSITION

[75] Inventors: Takeshi Kotani; Yoshiaki Horiuchi; Yoichi Kamata, all of Tatsuno, Japan

[73] Assignee: Nagase Kasei Kogyo Kabushiki Kaisha, Osaka, Japan

[21] Appl. No.: 663,455

[22] Filed: Oct. 22, 1984

[30] Foreign Application Priority Data

Oct. 21, 1983 [JP] Japan .................. 58-198046

[51] Int. Cl.$^4$ .............................................. G03C 1/52
[52] U.S. Cl. .................... 430/192; 430/193; 430/311; 430/510
[58] Field of Search ............... 430/191, 192, 196, 197, 430/311, 510, 193

[56] References Cited

U.S. PATENT DOCUMENTS

| 4,349,619 | 9/1982 | Kamoshida et al. | 430/196 |
| 4,356,254 | 10/1982 | Takahashi et al. | 430/191 |
| 4,370,405 | 1/1983 | O'Toole et al. | 430/191 |
| 4,414,314 | 11/1983 | Kaplan et al. | 430/330 |

Primary Examiner—J. Travis Brown
Attorney, Agent, or Firm—Wenderoth, Lind & Ponack

[57] ABSTRACT

A positive photoresist composition in the form of solution which comprises a resin soluble in an aqueous alkaline solution, a 1,2-quinonediazide derivative as a photosensitizer, and at least one anti-halation agent in amounts of about 1 to about 10 parts by weight in relation to 100 parts by weight of the resin in the composition, the anti-halation agent being selected from the group consisting of dyestuffs of specific structures.

2 Claims, 12 Drawing Figures

PHOTORESIST COMPOSITION

This invention relates to a novel positive photoresist composition, more particularly to such a positive photoresist composition that substantially no halation takes place when electromagnetic waves such as the ultraviolet light are irradiated on the layer of the composition on substrates.

Negative photoresist compositions have been heretofore widely used for the manufacturing of integrated circuits. However, integrated circuits of late are increasingly highly integrated, and for example, VLSIs have appeared and have been put to, and this high integration has made the negative photoresist composition unusable for the manufacture of such VLSIs on account of the limitation in the resolution inherent to the composition. That is, the smallest elements in the VLSI are less than about 1 μm or 2 μm in size whereas the negative photoresist composition uses organic solvents such as hydrocarbons as a developer so that the resist images formed are swollen and the resolution is inevitably limited to several microns. Therefore the positive photoresist composition is exclusively used for the manufacture of such a highly integrated circuit as the VLSI.

In general positive photoresist compositions are prepared by dissolving either a mixture of a resin soluble to an aqueous alkaline solution, e.g., a novolak cresol resin, and a photosensitizer, e.g., a monomeric 1,2-quinonediazide derivative such as 1,2-naphthoquinonediazide-5-sulfonic acid ester of 2,3,4-trihydroxybenzophenone, or a polymeric 1,2-quinonediazide derivative such as condensation products of 1,2-naphthoquinonediazide-5-sulfonyl chloride with a novolak cresol resin, in organic solvents.

When a positive photoresist composition composed of a mixture of the resin soluble in an aqueous alkaline solution and the monomeric 1,2-naphthoquinonediazide derivative as above mentioned is used as an example, the photoresist composition itself is only slightly soluble in an aqueous alkaline solution whereas when the composition is exposed to light the quinonediazide derivative is converted to indene carboxylic acid derivatives so that the photoresist composition becomes readily soluble in the aqueous alkaline solution. Therefore, when the coating layer of the photoresist composition on a substrate is exposed to light through a mask to solubilize the exposed areas, and then the exposed areas are dissolved in and removed by the aqueous alkaline solution as a developer, positive patterns of photoresist or resist images are formed on the substrate.

As above explained, since the positive photoresist composition uses an aqueous alkaline solution as a developer, it forms resist images with a higher resolution and with substantially no swelling compared with the case of a negative photoresist composition wherein organic solvents are used as a developer to cause the swelling of resist images and the reduction of the resolution. However, the halation takes place when the layer of photoresist compositions, either negative or positive, is exposed image-wise to light. In detail, as illustrated in FIG. 1, when a coating 1 of photoresist composition on a substrate 2 which is highly reflective such as aluminum or chromium is exposed image-wise to light 3 through a mask 4 having desired patterns consisting of opaque areas 5 and transparent areas 6, the incident light 3 passes the transparent areas of the mask to reach the coating to form the exposed areas 7, then the light 8 reflected on the substrate turns aside to reach the unexposed areas 9 of the coating of the photoresist composition also causing these to be exposed. This phenomenon is generally called halation in the field of fabrication of integrated circuits, and makes difficult to form resist images which are exactly according to the width of the circuit patterns of the mask. That is, the resist images are formed with decreased resolution. In particular, the halation is remarkable when the surface of the substrate having terraces 10 thereon, as illustrated in FIG. 1.

As disclosed in Japanese Patent Publication No. 51-37562, a negative photoresist composition is already known which includes one of organic dyestuffs generally called Oil Yellow capable of absorbing the light of 350–450 nm in the ultraviolet region so as to reduce the transmittance of the light by the photoresist layer and attenuate the light reflected by the surface of the substrate and transmitted by the photoresist layer to prevent the halation and the lowering of the resolution in the unexposed areas caused by the reflected light.

However, since photoresist compositions are usually applied in the form of a solution on a substrate, and taking a positive photoresist composition as an example, the coating composition, after the application, is usually heated, i.e., prebaked, to temperatures of about from 80° C. to 100° C. to volatilize the solvents therefrom completely without the decomposition of 1,2-quinonediazide derivative to form a layer of the composition firmly adhered to the substrate. On this heating of the photoresist layer, Oil Yellow readily sublimes so that the degree of halation prevention effect is widely varied depending on prebaking conditions but also it occurs that no prevention is attained. When the prebaking temperature is lowered to avoid the sublimation of Oil Yellow, the solvent remains in the prebaked photoresist layer so that not only the layer is adhered very weakly but also the resolution of the resist images is remarkably decreased.

It is therefore an object of the present invention to provide a novel positive photoresist composition by the use of which substantially no halation of the photoresist layer takes place when it is exposed to light through a mask with desired circuit patterns.

The positive photoresist composition in the form of a solution of the invention comprises a resin soluble in an aqueous alkaline solution, a 1,2-quinonediazide derivative as a photosensitizer, and at least one anti-halation agent in amounts of about 1 to about 10 parts by weight in relation to 100 parts by weight of the resin in the composition, the anti-halation agent being selected from the group consisting of:

(A) a compound having the general formula of

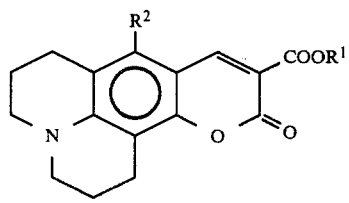

wherein $R^1$ and $R^2$ each represent a hydrogen, an alkyl, an alkenyl, an aryl or an aralkyl group;

(B) a compound having the general formula of

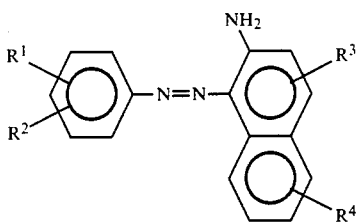

wherein $R^1$, $R^2$, $R^3$ and $R^4$ each represent a hydrogen, an alkyl, an alkenyl, an aryl or an aralkyl group;

(C) a compound having the general formula of

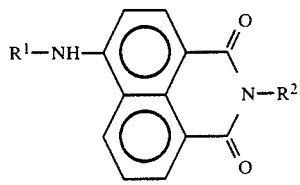

wherein $R^1$ represent a hydrogen, an alkyl or an alkoxyalkyl group, and $R^2$ represent an alkyl, an alkoxyalkyl or an aryl group which may contain one or more of hydrophilic substituents; and, (D) a compound having the general formula of

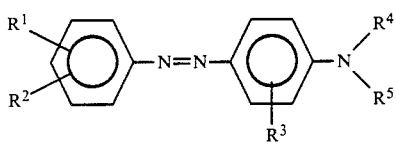

wherein $R^1$ and $R^2$ each represent a hydrogen, an alkyl, an alkoxy, a nitro or a halogen, $R^3$ represent a hydrogen, an alkyl or an acylamino, $R^4$ and $R^5$ each represent an alkyl, a hydroxyalkyl, an alkoxyalkyl, an alkoxycarbonylalkyl or an aralkyl.

The positive photoresist composition of the invention is a solution composition which includes as a resin component a resin soluble to an aqueous alkaline solution and as a photosensitizer an 1,2-quinonediazide derivative. The resin and the 1,2-quinonediazide derivative may be used as a mixture or may be used as a sensitized polymeric material in which the 1,2-quinonediazide derivative is bound to a resin as pendant groups.

As the resin, novolak resins of phenol or cresol are preferably used, for example. The 1,2-quinonediazide derivative usable as the photosensitizer includes condensation products of 1,2-naphthoquinonediazide sulfonic acid chloride or 1,2-benzoquinonediazide sulfonic acid chloride with phloroglucin, 2,3,4-trihydroxybenzophenone, 2,4,6-trihydroxybenzophenone or gallic acid esters. One of the sensitized polymeric 1,2-quinonediazide derivatives preferably used may be a condensation product of 1,2-naphthoquinonediazide sulfonic acid chloride or 1,2-benzoquinonediazide sulfonic acid chloride with a novolak resin.

Various resins to which the 1,2-quinonediazide derivative is bound to prepare polymeric 1,2-quinonediazide derivatives are also known. Any one of such known resins is usable in the invention, among which are, for example, novolak cresol resins, polyaminostyrenes and polyhydroxystyrenes.

A solvent is included in the positive photoresist composition to dissolve the resin and sensitizer, or the sensitized polymeric material therein. The solvent preferably used is composed mainly of ethyl cellosolve acetate. Thus, for example, a mixed solvent composed of ethyl cellosolve acetate and small amounts of aromatic hydrocarbons, ketones and esters is preferably used in the invention.

The positive photoresist compositions as above are already known, which include AZ series products of Shipley, OFPR series products of Tokyo Ohka Kogyo K.K. and KMPR 809 and 820 of Eastman Kodak.

The positive photoresist composition of the invention includes at least one anti-halation agent as previously specified. The preferred anti-halation agents used in the invention are as follows:

Compounds wherein $R^1$ is an alkyl of 1 to 5 carbons and $R^2$ is hydrogen in the general formula A, and an example thereof is a dyestuff known as Coumarine 314 represented by the formula (a):

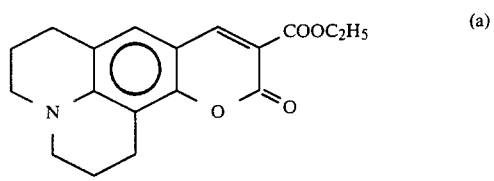

Compounds wherein $R^1$ is an alkyl of 1 to 5 carbons and $R^2$ through $R^4$ are all hydrogens in the general formula B, and an example thereof is a dyestuff known as Oil Yellow OB represented by the formula (b):

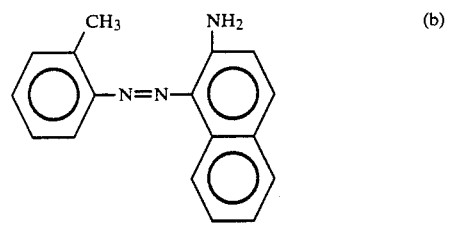

Compounds wherein $R^1$ and $R^2$ are both alkyls of 1 to 5 carbons in the general formula C, and an example thereof is a dyestuff known as Kayaset Flavin FG (Nippon Kayaku K.K.) represented by the formula (c):

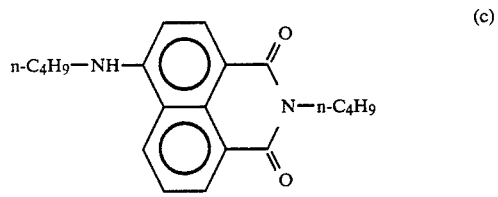

and,

Compounds wherein $R^1$ is a nitro, $R^2$ and $R^3$ are hydrogens, $R^4$ is an alkyl of 1 to 5 carbons, $R^5$ is a hydroxyalkyl of 1 to 5 carbons in the general formula D, and an example thereof is a dyestuff known as Kayaset Scarlet 926 (Nippon Kayaku K.K.) represented by the formula (d):

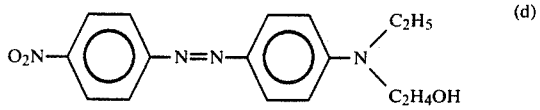

The anti-halation agent is included in the photoresist composition of the invention in amounts of 1–10 parts by weight, preferably 2–5 parts by weight, in relation to 100 parts by weight of the resin in the photoresist composition. When a sensitized polymeric 1,2-quinonediazide derivative is used, the weight of the resin means the weight of the resin except the portions of 1,2-quinonediazide derivatives bound thereto. When the amount of the anti-halation agent in the composition is smaller than about 1 part by weight in relation to 100 parts by weight of the resin, the agent fails to prevent the halation sufficiently, while it is rather difficult to have the agent contained in the photoresist composition in amounts more than about 10 parts by weight in relation to 100 parts by weight of the resin in the composition on account of the limited solubilities of the agent in the composition, but also the use of too much an amount of the agent is not desirable on account of deterioration of pattern images after the development and postbaking.

The anti-halation agent used in the invention functions as an absorber of ultraviolet light, and is especially excellent in the absorption of 436 nm (g-light) and 405 nm ultraviolet light. Therefore the agent reduces the transmittance of the light by the photoresist layer and attenuates the light reflected by the surface of the substrate to turn aside into the unexposed areas, thereby preventing the halation effectively and making possible the microfabrication of the substrate with a high resolution.

Further since the anti-halation agent used in the invention hardly sublimes at high temperatures, it is retained with substantially no sublimation in a photoresist layer even when the layer is heated at 80°–100° C. which is usually applied to the prebaking of the coating layer of the positive photoresist composition. Therefore the photoresist composition containing the anti-halation agent of the invention forms desired resist images on a highly reflective substrate even if it has terraces thereon by preventing the halation effectively when being exposed to light to provide a microfabricated substrate with a high resolution.

The invention will be more clearly understood by reference to the following examples, which however are intended only to illustrate the invention and are not to be construed as limiting the scope of the invention.

EXAMPLE

One hundred parts by weight of a novolak cresol resin and 25 parts by weight of 1,2-naphthoquinonediazide sulfonic acid ester were dissolved in a mixed solvent composed of 270 parts by weight of ethyl cellosolve acetate and 30 parts by weight of γ-butyrolactone to prepare a positive photoresist composition according to the prior art.

The anti-halation agent represented by the formula (a), (b), (c), or (d) was dissolved in the photoresist composition in varied amounts of up to 5 parts by weight in relation to 100 parts by weight of the resin to provide a positive photoresist composition of the invention.

The photoresist composition was then applied on a silicon dioxide ($SiO_2$) layer 0.6 μm in thickness on a silicon wafer by a conventional spin coating technique so as to form thereon a coating about 1.2 μm in thickness, and was then prebaked at a temperature of 95° C. for 30 minutes. Then using an ultraviolet irradiation apparatus PLA 501 F (Canon), the ultraviolet light, after substantially removing the i-light therefrom by passing the light through the two filters, UC-10 and L-39, was irradiated through a mask having desired circuit patterns on the photoresist composition layer to form resist images on the substrate.

Thereafter the substrate was bathed with shaking in a developer solution composed of Kodak Micropositive Resist Developer 932 (Eastman Kodak) diluted with the same amount of ultra-pure water for 1 minute, rinsed with ultra-pure water for 20 seconds, and then postbaked at a temperatures of 130° C. for 30 minutes to form baked resist images.

The contents of the anti-halation agent in the photoresist composition and the light integraters or LI values of the resultant photoresist compositions are shown in TABLE. Since the LI value is a parameter related to the exposure energy, the increase in the LI value of the photoresist composition of the invention demonstrates that the halation is effectively prevented at the time of the image-wise exposure of the layer of the composition to the light.

FIGS. 2 through 5 illustrate the relationship between the LI value and the thickness retention which is defined as $w/w_o$ wherein $w_o$ is the weight of the coating of photoresist composition per unit area before the exposure to the light and w is the weight of the coating after the exposure and

TABLE

| | Runs | Anti-halation Agent Formula | Content* | LI values | γ - Values |
|---|---|---|---|---|---|
| Comparative | 1 | — | 0 | 3.5 | 2.9 |
| | 2 | (a) | 2.5 | 4.0 | 2.9 |
| Comparative | 3 | — | 0 | 3.0 | 2.9 |
| | 4 | (b) | 3.0 | 4.7 | 1.9 |
| | 5 | (b) | 4.0 | 5.5 | 1.5 |
| | 6 | (b) | 5.0 | 6.2 | 1.4 |
| Comparative | 7 | — | 0 | 3.0 | 2.9 |
| | 8 | (c) | 3.0 | 4.6 | 2.5 |
| | 9 | (c) | 5.0 | 5.7 | 1.8 |
| Comparative | 10 | — | 0 | 3.0 | 2.9 |
| | 11 | (d) | 2.0 | 4.6 | 2.3 |
| | 12 | (d) | 4.0 | 6.4 | 2.3 |
| | 13 | (d) | 5.0 | 7.5 | 1.8 |

*Parts by weight to 100 parts by weight of the resin in the photoresist composition.

development (Yoshinaga et. al., Kogyo Kagaku Zasshi, 66, 665 (1963)). As apparent all the photoresist compositions of the invention are superior in the thickness retention to the prior art composition. FIGS. 6 through 9 illustrate the relationship between the content of the anti-halation agent in the composition and the gram absorptivity, which is a value characteristic of the material under examination and is defined as the absorbence/the cell length (cm)×concentration (g/l) in which the concentration is a content of the resin components in the photoresist composition. As apparent the positive photoresist composition of the invention in particular prevents the halation satisfactorily by the ultraviolet light of 436 nm and 405 nm in the wavelength.

Figure 10:
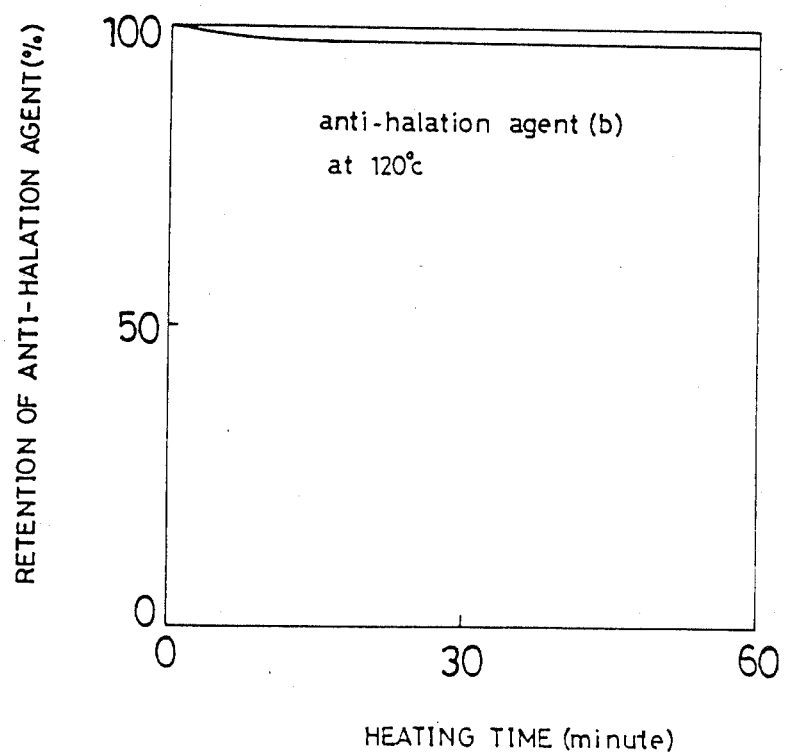
Figure 11:
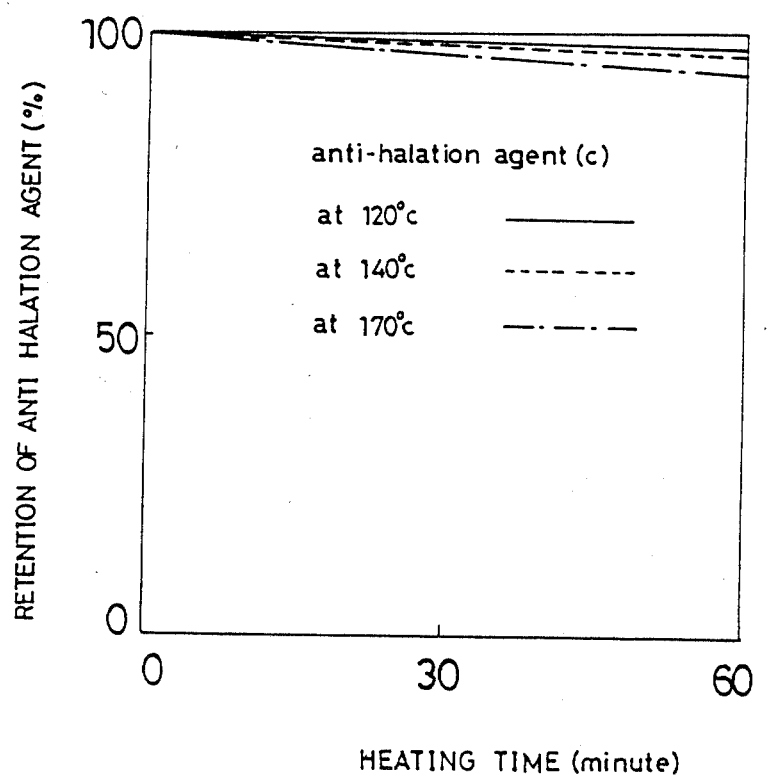
Figure 12:
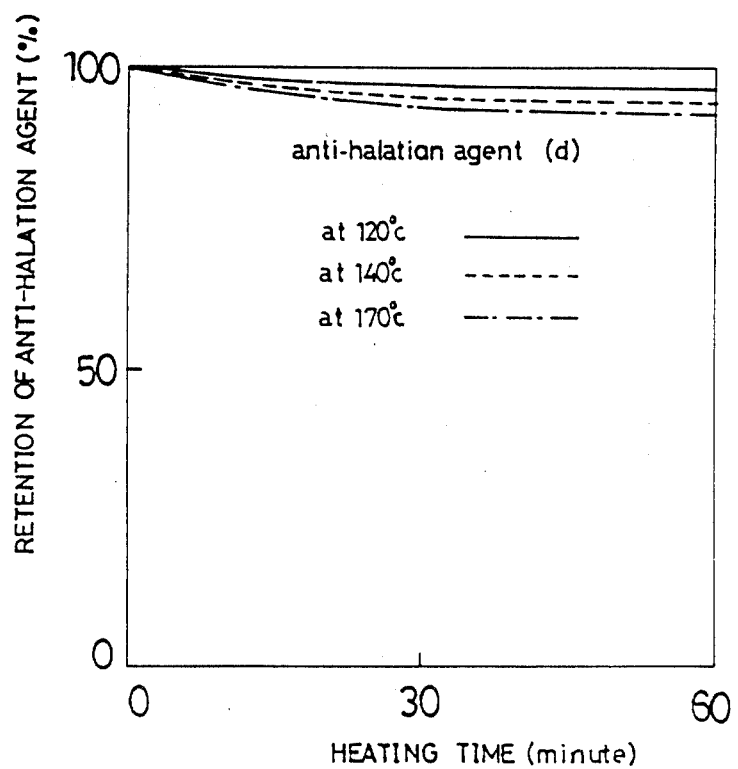

FIGS. 10 through 12 illustrate the percentage of the retention of the anti-halation agent in the photoresist composition of the invention when being heated. Substantially no sublimation of the anti-halation agents

What is claimed is:

1. A positive photoresist composition in the form of solution which comprises a resin soluble in an aqueous alkaline solution, a 1,2-quinonediazide derivative as a photosensitizer, and an anti-halation agent having the general formula of

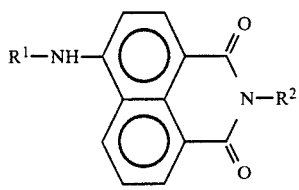

wherein $R^1$ represents a hydrogen, an alkyl or an alkoxyalkyl group, and $R^2$ represents an alkyl, an alkoxyalkyl or an aryl group which may contain one or more of hydrophilic substituents, in amounts of about 1 to about 10 parts by weight in relation to 100 parts by weight of the resin in the composition.

2. The positive photoresist composition as claimed in claim 1 wherein the anti-halation agent is

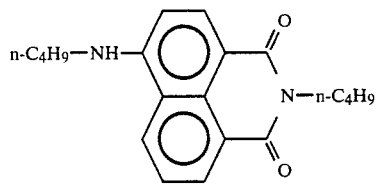

* * * * *